(12) United States Patent
Shore et al.

(10) Patent No.: US 7,196,469 B2
(45) Date of Patent: Mar. 27, 2007

(54) REDUCING UNDESIRABLE ABSORPTION IN A MICROCAVITY OLED

(75) Inventors: Joel D. Shore, Rochester, NY (US); Dustin L. Winters, Webster, NY (US); Michael L. Boroson, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 327 days.

(21) Appl. No.: 10/871,190

(22) Filed: Jun. 18, 2004

(65) Prior Publication Data

US 2005/0280362 A1   Dec. 22, 2005

(51) Int. Cl.
*H01J 1/62* (2006.01)
*H05B 33/00* (2006.01)

(52) U.S. Cl. .................. 313/506; 313/504; 313/505; 313/113; 428/690; 428/917

(58) Field of Classification Search ................. None
See application file for complete search history.

(56) References Cited

U.S. PATENT DOCUMENTS

| | | | |
|---|---|---|---|
| 4,356,429 A | 10/1982 | Tang | |
| 4,720,432 A | 1/1988 | VanSlyke et al. | |
| 5,405,710 A | 4/1995 | Dodabalapur et al. | |
| 5,554,911 A | 9/1996 | Nakayama et al. | |
| 5,652,067 A * | 7/1997 | Ito et al. | 428/690 |
| 5,847,506 A | 12/1998 | Nakayama et al. | |
| 6,366,017 B1 * | 4/2002 | Antoniadis et al. | 313/506 |
| 6,392,340 B2 | 5/2002 | Yoneda et al. | |
| 6,680,570 B2 | 1/2004 | Roitman et al. | |
| 6,737,800 B1 * | 5/2004 | Winters et al. | 313/504 |
| 6,861,800 B2 * | 3/2005 | Tyan et al. | 313/506 |
| 7,030,553 B2 * | 4/2006 | Winters et al. | 313/504 |
| 7,057,339 B2 * | 6/2006 | Boroson et al. | 313/504 |
| 2002/0186214 A1 | 12/2002 | Siwinski | |
| 2004/0066139 A1 | 4/2004 | Hamada et al. | |
| 2004/0211956 A1 * | 10/2004 | Kanno et al. | 257/40 |

FOREIGN PATENT DOCUMENTS

WO   2004/044998 A2   5/2004

\* cited by examiner

*Primary Examiner*—Sikha Roy
(74) *Attorney, Agent, or Firm*—Raymond L. Owens

(57) ABSTRACT

An OLED device that has at least one first pixel that emits light in a desired region of the visible light spectrum including one or more light-emitting layer(s) and a reflector and a semitransparent reflector respectively disposed on opposite sides of the light-emitting layer(s) and arranged to resonate light produced by such layers such that the light produced by the at least one first pixel has a spectral component in the desired region of the visible light spectrum. The device also includes at least one layer disposed at a predetermined position between the reflector and semitransparent reflector which undesirably absorbs light in at least a portion of the desired region of the visible light spectrum, and wherein the predetermined position of the undesirably absorbing layer is selected to reduce the absorption of such layer in the desired region of the visible light spectrum.

13 Claims, 4 Drawing Sheets

REDUCING UNDESIRABLE ABSORPTION IN A MICROCAVITY OLED

CROSS REFERENCE TO RELATED APPLICATIONS

Reference is made to commonly assigned U.S. patent application Ser. No. 10/869,115 filed Jun. 16, 2004, now U.S. Pat. No. 7,023,013 by Michele L. Ricks et al. entitled "Array of Light-Emitting OLED Microcavity Pixels", and commonly assigned U.S. patent application Ser. No. 10/838,665 filed May 4, 2004 by Tukaram K. Hatwar, et al., entitled "Improved Tuned Microcavity Color OLED Display", the disclosures of which are herein incorporated by reference.

FIELD OF INVENTION

This invention relates to microcavity organic electroluminescent (EL) devices.

BACKGROUND OF THE INVENTION

Full color organic electroluminescent (EL) devices, also known as organic light-emitting devices or OLED, have recently been demonstrated as a new type of flat panel display. In simplest form, an organic EL device is comprised of an electrode serving as the anode for hole injection, an electrode serving as the cathode for electron injection, and an organic EL medium sandwiched between these electrodes to support charge recombination that yields emission of light. An example of an organic EL device is described in commonly assigned U.S. Pat. No. 4,356,429. In order to construct a pixelated display device such as is useful, for example, as a television, computer monitor, cell phone display or digital camera display, individual organic EL elements can be arranged as an array of pixels in a matrix pattern. OLED displays can be made to have one or more colors. These displays are known as multicolor displays. Full color OLED devices are also known in the art. Typical full color OLED devices are constructed of pixels that are red, green, and blue in color. That is, these pixels emit light in the red, green, and blue regions of the visible light spectrum. As such, the emitted light from the pixels would be perceived to be red, green, or blue by a viewer. These differently colored pixels are sometimes referred to as subpixels which taken together as a group form a single full-color-pixel. Full color organic electroluminescent (EL) devices have also recently been described that are constructed of pixels that are red, green, blue, and white in color. Such an arrangement is known as an RGBW design. An example of an RGBW device is disclosed in U.S. Patent Application Publication 2002/0186214 A1 now U.S. Pat. No. 7,012,588.

Several approaches to obtaining color displays are known in the art. For example, each differently colored pixel can be constructed using one or more different OLED materials. These materials are selectively placed on the differently colored pixels by methods including deposition through shadow masks, thermal transfer from a donor sheet, or ink jet printing. Another approach to producing a color display is to place OLED materials in a common stack of one or more layers across all the differently colored pixels, and then use one or more different color filters to selectively convert the common OLED color to different colors for each differently colored pixel. In this case the OLED materials are typically arranged so as to produce a broad emission spectrum, also referred to as white emission or white OLED. An example of a white OLED with color filters is disclosed in U.S. Pat. No. 6,392,340.

OLED devices having microcavity structures have been shown in the art. An example of an OLED microcavity device is shown in U.S. Pat. No. 5,847,506. In such a microcavity structure, light emitted by the OLED resonates between a reflector and a semitransparent reflector. The optical distance between the reflector and the semitransparent reflector can be adjusted to select the wavelength or wavelengths of light enhanced by the microcavity structure. Such a microcavity structure can yield highly efficient emission with a sharp emission spectrum that results in pure colors. It is possible to use such a microcavity structure in a device in which each differently colored pixel is constructed using one or more different OLED materials emitting in a certain region of the spectrum or, because of the microcavity structure's sharp output emission, to use it with broadband emitting materials that are common to all of the differently colored pixels, even in the absence of color filters applied to the differently colored pixels. In both cases, the optical length of the microcavity can be adjusted separately for each differently colored pixel in order to tune the output color of the differently colored pixel. Examples of OLED devices using broad emitting materials that have been coupled with a microcavity structure where the microcavity is separately adjusted for each differently colored pixel to produce a multicolor display are shown in U.S. Pat. Nos. 5,405,710 and 5,554,911.

Microcavity structures are commonly formed with highly transparent materials within the cavity between the reflector and semitransparent reflector. However, some materials that are commonly used in the construction of OLED devices are partially absorbing in the desired visible wavelengths. For example, OLED devices are frequently produced with a hole injecting layer to improve hole injection from the anode. One common hole injecting layer is CuPC (Copper (II) phthalocyanine) as described in U.S. Pat. No. 4,720,432. A hole injecting layer composed of a CuPC film followed by a thin fluorocarbon ($CF_x$) film has also been described in the art. An example of such a CuPC device with a CFx film is discussed in U.S. Patent Application Publication 2004/0066139 A1 now U.S. Pat. No. 6,936,926.

CuPC is known to have significant absorbance for visible light of wavelengths greater than approximately 550 nm. In an OLED device that does not have a microcavity structure, this absorbance effect might be tolerable. However, because of the resonant nature of a microcavity structure, with light executing multiple reflections back and forth in the cavity, an OLED device constructed with a microcavity structure and having any partially absorbing materials within the cavity can have a substantial loss in light output efficiency due to the absorptions by these materials in the cavity. Therefore it is desired to have an optimized OLED device constructed with a microcavity structure that is tolerant of having an undesirably-absorbing material within the cavity wherein the loss due to the absorbance is reduced.

SUMMARY OF THE INVENTION

It is therefore an object of the present invention to provide a microcavity OLED device having high efficiency despite the presence of undesirably absorbing materials within the cavity. This object is achieved by providing a microcavity OLED device that has at least one first pixel that emits light in a desired region of the visible light spectrum, comprising:

a) one or more light-emitting layer(s);

b) a reflector and a semitransparent reflector respectively disposed on opposite sides of the light-emitting layer(s) and arranged to resonate light produced by such layers such that the light produced by the device has spectral component in the desired region of the visible light spectrum;

c) at least one layer disposed at a predetermined position between the reflector and semitransparent reflector which undesirably absorbs light in at least a portion of the desired region of the visible light spectrum; and d) wherein the predetermined position of the undesirably absorbing layer is selected to reduce the absorption of such layer in the desired region of the visible light spectrum.

ADVANTAGES

The invention has the advantage over prior art microcavity devices in having high efficiency even at wavelengths at which one or more of the materials in the cavity have significant optical absorption.

Since device feature dimensions such as layer thicknesses are frequently in sub-micrometer ranges, the drawings are scaled for ease of visualization rather than dimensional accuracy.

DETAILED DESCRIPTION OF THE INVENTION

In the discussion that follows, the term "complex refractive index" is used to refer to the refractive index of a material specified by the complex number n+ik where $i=\sqrt{-1}$. The term "index of refraction" is used to refer to the real part, n, of the complex refractive index. The optical thickness of a layer is defined here as the real part, n, of the refractive index multiplied by the thickness of said layer.

OLED microcavity devices are constructed by placing the electroluminescent organic medium between a reflector and a semitransparent reflector. The optical thickness of the layers between reflector and the semitransparent reflector are optimized to form a cavity that resonates light of a particular wavelength. OLED microcavity devices can be constructed with a Quarter Wave Stack (QWS) serving the function of the semitransparent reflector. An example of an OLED microcavity device with a QWS is shown in U.S. Pat. No. 5,405,710. OLED microcavity devices can also be formed using a thin metallic layer to form the semitransparent reflector. An example of an OLED microcavity device with a thin metallic layer as the semitransparent reflector is discussed in N. Takada, T. Tsutsui, S. Saito, Appl. Phy. Lett. 63 (15), 2032–2034 (1993). Microcavity devices tend to have narrow and intense spectral emission when viewed at the normal (0 degree) viewing angle. This effect can be used to produce full color devices from a single broad spectrum emitting OLED medium such as shown in U.S. Pat. No. 5,554,911.

Figure 1:
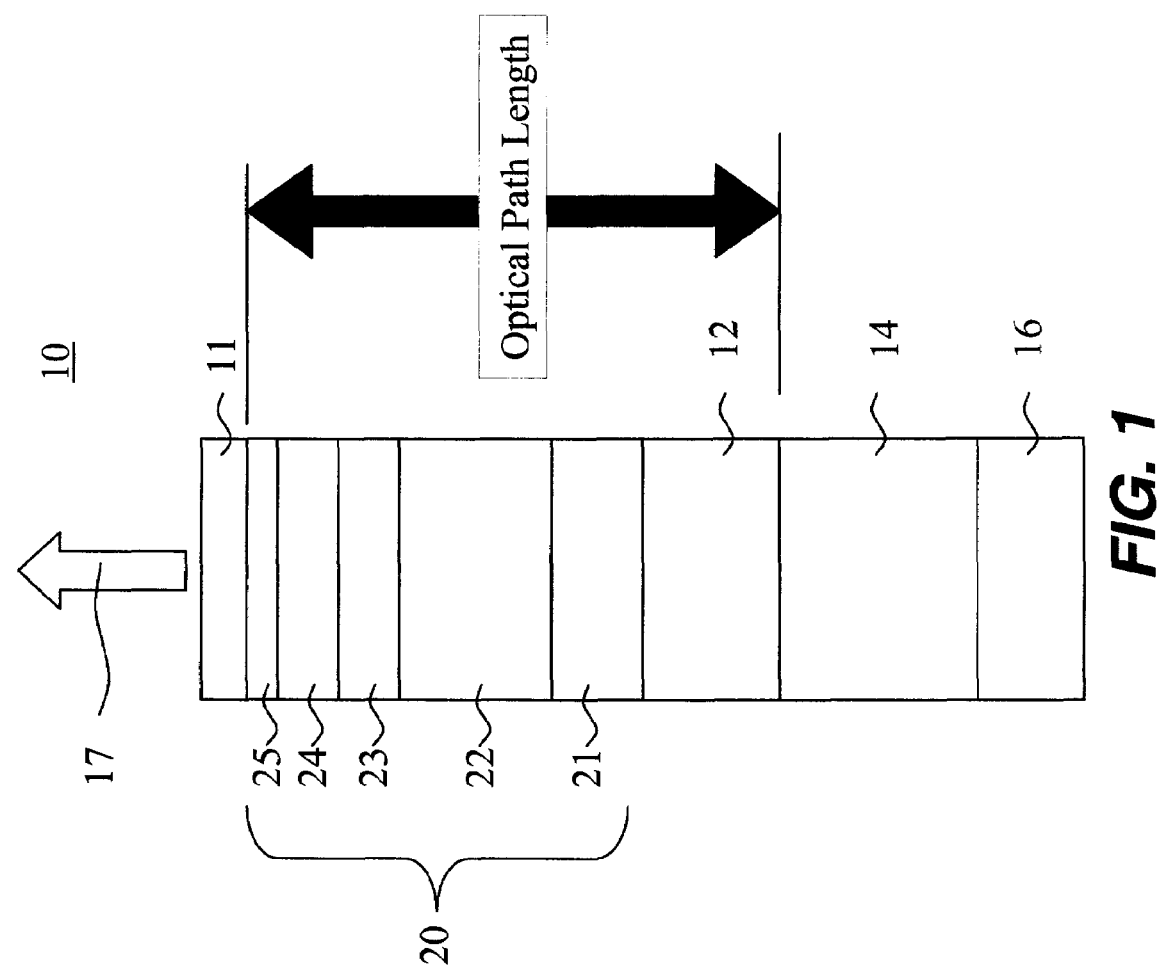
FIG. 1 depicts a cross-sectional view of a microcavity device according to the present invention.

FIG. 1 is an enlarged cross section of a simplified OLED microcavity device 10 according to the present invention. The OLED microcavity device 10 is constructed of a semitransparent reflector 11, a cavity spacer 12, an organic EL medium 20, a reflector 14, and a substrate 16. In such a microcavity device, light is produced in the organic EL medium 20 and resonates between the reflector 14 and the semitransparent reflector 11 and exits the device through the semitransparent reflector 11 toward the viewer. The cavity spacer 12 is constructed of a transparent material such as indium-tin oxide (ITO), indium-zinc oxide (IZO), zinc-tin oxide (ZTO), tin-oxide (SnOx), indium oxide (InOx), molybdnum oxide (MoOx), tellurium oxide (TeOx), antimony oxide (SbOx), and zinc oxide (ZnOx). In this example the cavity spacer layer also serves as the first electrode for the OLED device. While the cavity spacer layer is shown as a single layer, it can alternately be composed of several layers. The cavity spacer layer can be deposited by methods known in the art such as sputtering and patterned by techniques known in the art such as by photolithography and etching or by deposition through a shadow mask. The reflector 14 is preferably constructed of a highly reflective metal including but not limited to Al, Ag, Au, and alloys thereof. The reflector can be deposited by methods known in the art such as thermal evaporation or sputtering and patterned by methods known in the art such as photolithography and etching or by deposition through a shadow mask. The semitransparent reflector 11 is preferably constructed of a thin metal layer such as Ag or an alloy of Ag, which is preferably between 5 nm and 35 nm in thickness. In this example, the semitransparent reflector also serves as the second electrode for the OLED device. The semitransparent reflector can be deposited by methods known in the art such as thermal deposition.

The organic EL medium 20 is located between the first and second electrodes, in this case the cavity spacer 12 and the reflector 14, and can be chosen from many organic materials known in the art. The organic EL medium is typically constructed of several sublayers. The organic EL medium can be constructed of small molecule organic materials, which are typically deposited by evaporation methods or by thermal transfer from a donor substrate. Alternately, the organic EL medium can be constructed of polymer materials, commonly referred to as PLED's, which can be deposited by methods such as ink jet printing or solvent spin or dip coating. The organic EL medium can be arranged to produce a narrow bandwidth emission spectrum or a broad or white emission spectrum. Many possible configurations and materials can be chosen for the organic EL medium by one skilled in the art. In this embodiment, the organic EL medium 20 is constructed of several sublayers such as a hole injecting layer 21, a hole transporting layer 22, a first light-emitting layer 23, a second light-emitting layer 24, and an electron transporting layer 25. A common material which is useful for hole injecting layer 21 is CuPC (Copper (II) phthalocyanine) as described in U.S. Pat. No. 4,720,432. A hole injecting layer composed of a CuPC film followed by a thin flurocarbon ($CF_x$) film has also been described in the art. An example of such a CuPC device with a $CF_x$ film is shown in U.S. Patent Application Publication 2004/0066139 A1. Alternate configurations having only a single light-emitting layer can also be constructed by those skilled in the art.

In a microcavity device such as microcavity device 10, the total optical thickness of the layers between the reflector and the semitransparent reflector, $\Sigma(n_i d_i)$, is designed so as to approximately satisfy the following equation:

$$2\Sigma(n_i d_i)/\lambda_0 + (\phi_1 + \phi_2)/(2\pi) = m_c \qquad \text{(Eq. 1)}$$

wherein:

$n_i$ is the index of refraction and $d_i$ is the thickness of the ith layer;

$\phi_1$ and $\phi_2$ are the phase shifts in radians at the reflector 14 interface and the semitransparent reflector 11, respectively;

$\lambda_0$ is the pre-determined primary wavelength to be emitted by the microcavity device, and in the context of this equation is also referred to as the resonant wavelength of the microcavity; and $m_c$ is a non-negative integer.

The sum in Eq. 1 is over those layers disposed between the reflector 14 and the semitransparent reflector 11. The product of the index of refraction and the thickness of a layer is defined as its optical thickness and thus $\Sigma(n_i d_i)$ represents the total optical thickness between the opaque reflector 14 and the semitransparent reflector 11.

Microcavity device 10 is shown as being constructed with the reflector 14 between the substrate 16 and the organic EL medium 20 such that light emission 17 exits the device in the opposite direction of the substrate. This configuration is known as a top emission device. In a top emission device, light does not pass through the substrate and the substrate can therefore be optionally opaque. This enables the use of a large variety of substrates. The substrate can be constructed of glass or plastic. Alternately, a substrate that can be used with a top emission configuration is a silicon wafer. The substrate can further include active matrix circuitry (not shown) to drive the microcavity device.

Alternately, the device could be arranged such that the substrate is between the viewer and the organic EL medium 20, and the semitransparent reflector 11 is between the organic EL medium 20 and the substrate. This configuration where light travels through the substrate is known as a bottom emission device. In this configuration, a transparent substrate such as glass or plastic is used. It will be understood by those skilled in the art that the considerations to be discussed below for the top emitter microcavity device 10 apply equally well for a bottom emitter microcavity device.

Microcavity device 10 is an example microcavity device structure. Several variations are known in the art and can also be applied to the present invention. For example, the semitransparent reflector 11 could have other layers placed on top of it, e.g., to reduce the absorption of light in the semitransparent reflector, to encapsulate the device, or to provide other beneficial features. The semitransparent reflector could also be constructed from a quarter wave stack of several alternating layers of transparent materials having different refractive indexes. The cavity spacer layer could alternately be placed between the reflector and the organic EL medium, or it could be eliminated entirely. In either of these cases, the semitransparent reflector would then need to serve as an electrode for the organic EL medium.

Optionally, a color filter element can be disposed outside of the microcavity structure on the side of the semitransparent reflector so as to be between the semitransparent reflector and the viewer. Color filter elements can be used to absorb undesired color emission from the microcavity device. In a multicolored pixelated display, it is preferable to locate the color filter element as close to the microcavity structure as possible to reduce pixel crosstalk. In a bottom emission device, the color filter element is therefore preferably located between the microcavity and substrate. However, the invention can also be made to work by placing the color filter element on the outside of the substrate. In a top emission device, the color filter element is preferably located above the microcavity structure. However, the invention can also be made to work by locating the color filter element on either side of an attached second cover substrate (not shown).

Figure 2:
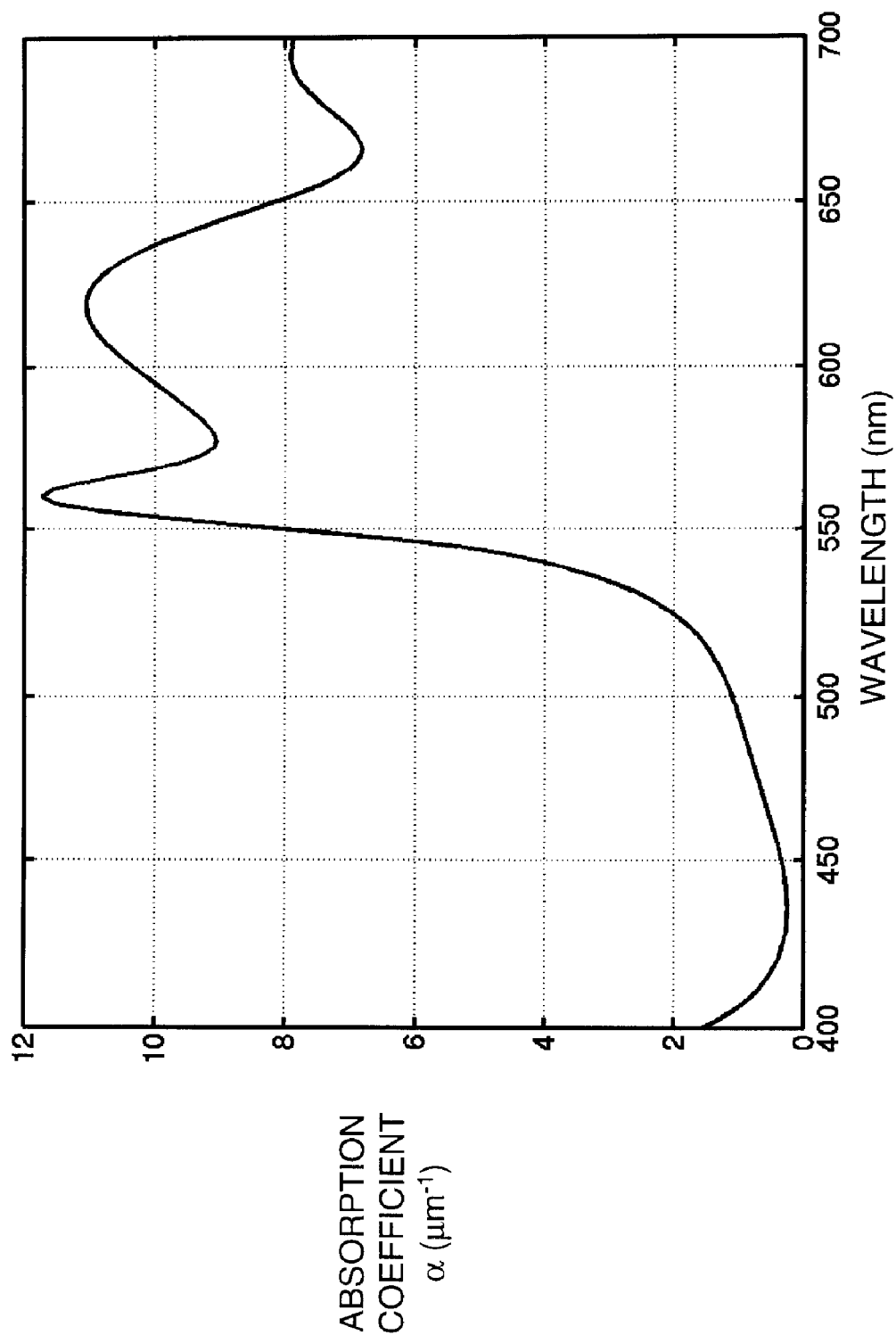
FIG. 2 depicts a graph illustrating the optical absorption coefficient of CuPC.

FIG. 2 illustrates the optical absorption coefficient $\alpha$ for CuPC. This coefficient was determined from the equation $\alpha = 4\pi k/\lambda$ where k is the imaginary part of the complex refractive index as measured by spectroscopic ellipsometry and $\lambda$ is the wavelength of light. It can be seen from FIG. 2 that there is significant optical absorption at wavelengths greater than approximately 550 nm.

It was recognized by the present inventors that because of the resonant nature of a microcavity structure, with light executing multiple reflections back and forth in the cavity, an OLED device constructed with a microcavity structure and having one or more undesirably absorbing materials such as CuPC within the cavity can have a substantial loss in light output efficiency due to the absorptions of these materials in the cavity.

It was expected that for microcavity devices the amount of absorption would increase, and thus the device output efficiency decrease, as any undesirably absorbing material such as CuPC is made thicker. However, an unexpected result, discussed below, is that the absorption and the resulting output efficiency also have a strong dependence on the exact location of the absorbing material within the microcavity structure.

Figure 3:
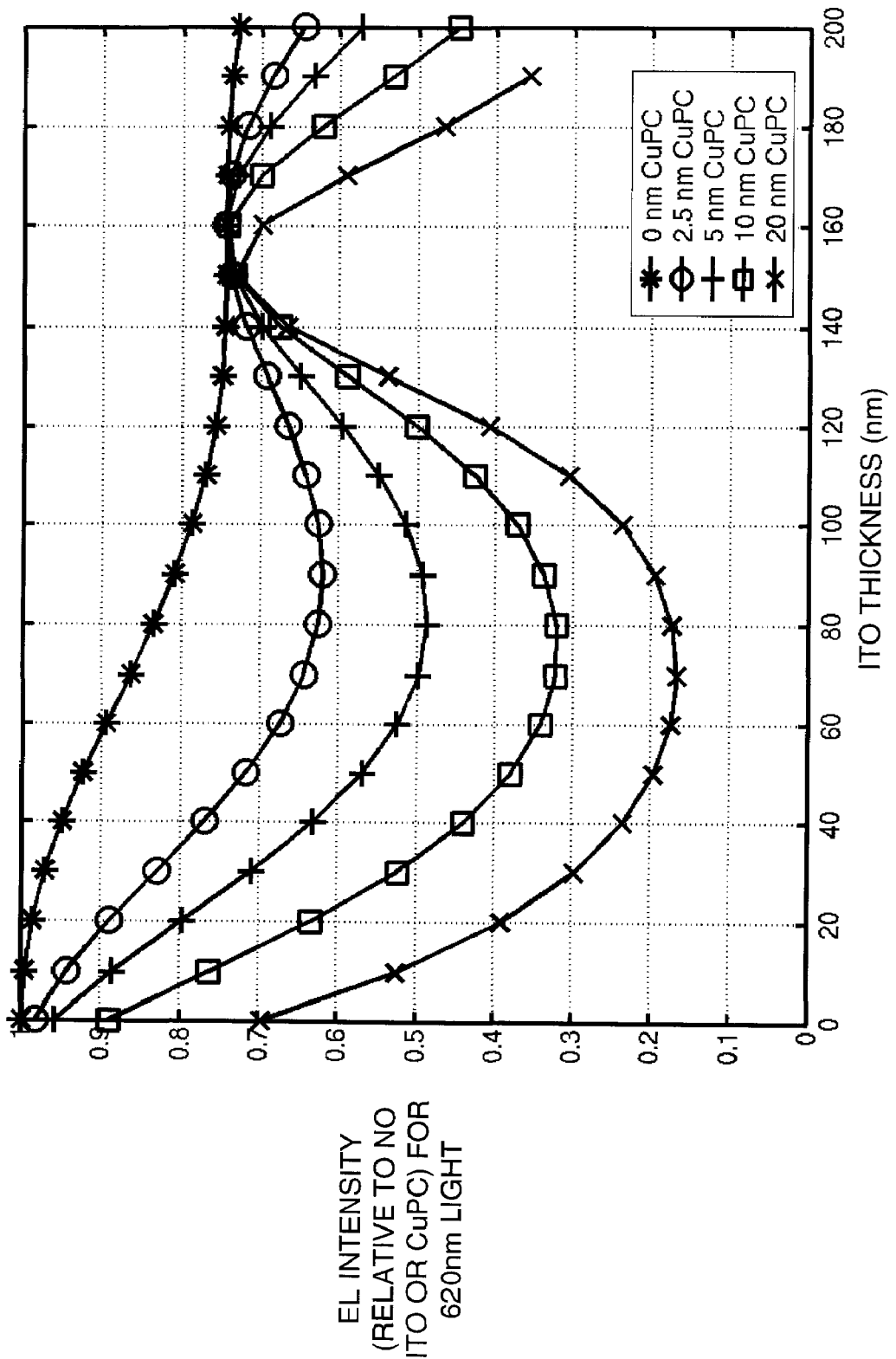
FIG. 3 depicts a graph illustrating the device efficiency versus relative location of the CuPC layer in the optical microcavity.

Turning now to FIG. 3, the results of optical modeling predictions for the EL intensity of a microcavity device tuned for peak emission at a wavelength of 620 nm, normalized by the EL intensity of the same device but with both the ITO and CuPC thickness set to 0, are shown. These results were obtained by modeling a series of microcavity devices constructed in the same manner as microcavity device 10 shown in FIG. 1. The devices modeled were comprised of 200 nm of Al for the reflector, varied thicknesses of ITO for the cavity spacer, varied thicknesses of CuPC for the hole-injecting layer, varied thicknesses of 4,4'-Bis[N-(1-naphthyl)-N-phenylamino]biphenyl (NPB) for the hole transport layer, 30 nm of NPB and rubrene in a ratio of 71:29 percent by volume (doped with unspecified dopant(s) presumed not to significantly alter the refractive index) for the first light-emitting layer, varying thicknesses of 2-tert-butyl-9,10-bis(2-naphthyl)anthracene (TBADN) (doped with unspecified dopant(s) presumed not to significantly alter the refractive index) for the second light-emitting layer, 10 nm of tris(8-quinolinolato)aluminum (III) (Alq) for the electron transport layer, and 20 nm of Ag for the semitransparent reflector. Note that any $CF_x$ film on the CuPC is thin enough to be essentially irrelevant from an optical point of view and is thus ignored. The substrate is also optically irrelevant since it lies below the 200 nm Al reflector.

The results shown in FIG. 3 were obtained using an optical model that solves Maxwell's Equations for the far-field emission of oscillating electric dipoles of random orientation embedded in a planar multilayer device under the assumption that the light propagates as plane waves (O. H. Crawford, J. Chem. Phys. 89, p. 6017, 1988; K. B. Kahen, Appl. Phys. Lett. 78, p. 1649, 2001). The emission is assumed to occur uniformly in the first 10 nm of the TBADN layer bordering the NPB+rubrene layer. For each layer, the model uses wavelength-dependent complex refractive indices that are either measured by spectroscopic ellipsometry or taken from the literature (Handbook of Optical Constants of Solids, ed. by E. D. Palik, Academic Press, 1985; Handbook of Optical Constants of Solids II, ed. by E. D. Palik, Academic Press, 1991; CRC Handbook of Chemistry and Physics, 83rd ed., edited by D. R. Lide, CRC Press, Boca Raton, 2002), interpolated to the relevant wavelength(s) as necessary. In particular, the complex refractive indices at 620 nm that were used in the modeling are 1.307+7.484i for Al, 1.791+0.014i for ITO, 1.684+0.545i for CuPC, 1.781 for NPB, 1.795+0.005i for NPB+rubrene, 1.782 for TBADN, 1.712 for Alq, and 0.269+4.181i for Ag.

Numerous comparisons between experiments and model results have confirmed that the model can accurately predict the electroluminescence from various OLED device structures. Note, however, that the optical model does not account for differences in the electrical properties of the device. This is, in fact, advantageous because it permits us to investigate the optical effects of device structures (such as those with no CuPC hole-injecting layer) that, if made in the laboratory, might not perform well for electrical reasons such as poor charge injection.

For each thickness of CuPC and ITO for which results are shown in FIG. 3, the thicknesses of the NPB and Alq layers were optimized by permitting them to vary in order to maximize the EL intensity in the microcavity structure. This ensures that the results shown in FIG. 3 represent the optical effects of the change in the thickness of the ITO layer (and resulting change in the location of the CuPC layer) independent of complicating factors such as changes in the resonant wavelength of the microcavity. The optimized value of the TBADN layer thickness is generally ~55 nm. The optimized value of the NPB layer thickness is such that the thicknesses of the NPB, CuPC, and ITO layers sum to about 210 to 220 nm.

There are various notable features that can be seen in FIG. 3. As expected, a thicker CuPC layer yields a lower EL intensity due to the absorption of the CuPC. However, as the location of the CuPC layer is varied by changing the thicknesses of the ITO and NPB layers that it is sandwiched between, there is considerable variation in the EL intensity. In particular, near 70 nm ITO thickness, the EL intensity reaches a minimum. Here, even the EL intensity for a device with only 2.5 nm of CuPC is reduced by ~25% relative to the device with the same thickness of ITO but no CuPC. For a device with 10 nm of CuPC, the reduction in EL intensity is more than 60%. By contrast, when the ITO thickness is near 150–160 nm, the EL intensity reaches a maximum. Here, the EL intensity of devices containing as much as 10 nm of CuPC is reduced by only a fraction of 1% from the EL intensity of a similar device without CuPC; even the intensity for device containing 20 nm of CuPC is reduced by less than 2%. This illustrates the dramatic effect that the location of an undesirably absorbing layer within the microcavity structure can have on device efficiency and thus the importance of properly locating undesirably absorbing layers in order to maximize the efficiency of the device.

A final feature of note in FIG. 3 is the gradual reduction in the EL intensity as the ITO thickness increases even for the case in which there is no CuPC. This occurs because the ITO itself has some weak absorbance at 620 nm. (The absorption coefficient used for the ITO at 620 nm was ~0.28 $\mu m^{-1}$ as compared to ~11.0 $\mu m^{-1}$ for CuPC. The absorption coefficient of ITO is sensitive to process details and can vary strongly from one experimental sample of ITO to another. The value used in FIG. 3 was one of the largest measured values.) However, as the ITO thickness is increased, the intensity does not decrease uniformly. Rather, it decreases most rapidly with increasing thickness for thickness in the vicinity of 70 nm and hardly decreases at all with increasing thickness for thickness in the vicinity of 160 nm. These results show that ITO added at about the same location in the microcavity where CuPC causes a large decrease in the EL intensity also causes a much larger decrease in intensity than the intensity decrease it causes when added at about the same location in the microcavity where CuPC causes only a minimal decrease in EL intensity. Therefore, the variation in EL intensity with ITO thickness in the absence of CuPC is further confirmation of the result that optically-absorbant materials absorb the emitted light much more strongly at certain locations in the microcavity than at certain other locations.

The locations of the undesirably absorbing CuPC layer corresponding to maxima and minima in the intensity of the EL spectrum can be understood and predicted by the following theoretical considerations. In a microcavity, the multiple reflections of the light set up a standing wave at the resonant wavelength. The amplitude of the electric field due to this standing wave will have the smallest magnitude at the nodes of the standing wave and the largest magnitude at the antinodes of the standing wave. The absorption of an electromagnetic wave in a medium is proportional to the product of the absorption coefficient of the medium and the square of the magnitude of the electric field. Therefore, the absorption will be largest (and the resulting EL intensity smallest) when the undesirably absorbing layer is in the vicinity of an antinode of the standing wave and smallest (with the resulting EL intensity largest) when the undesirably absorbing layer is in the vicinity of a node of the standing wave.

For a microcavity device such as microcavity device 10 having a resonant wavelength $\lambda_0$, optical considerations then predict that the location of the undesirably absorbing layer that produces a peak in the EL intensity is obtained by the requirement that the total optical thickness between the opaque reflector 14 and the center of the undesirably absorbing layer, satisfies the following equation:

$$[n_a d_a + 2\Sigma(n_i d_i)]/\lambda_0 + \phi_r/(2\pi) = m + \tfrac{1}{2} \qquad \text{(Eq. 2)}$$

wherein:

$n_a$ is the index of refraction and $d_a$ is the thickness of the undesirably absorbing layer;

$n_i$ is the index of refraction and $d_i$ is the thickness of the ith layer between the undesirably absorbing layer and the reflector 14;

$\phi_r$ is the phase shift in radians at the reflector 14 interface, chosen by convention to lie in the interval between $-\pi$ and $\pi$;

$\lambda_0$ is the resonant wavelength of the microcavity and corresponds with the primary wavelength emitted by the microcavity device; and m approaches an integer.

The sum in Eq. 2 is over those layers lying between the reflector 14 and the undesirably absorbing layer. The product of the index of refraction and the thickness of a layer is defined as its optical thickness and thus $\tfrac{1}{2} n_a d_a + \Sigma(n_i d_i)$ represents the total optical thickness between the opaque reflector 14 and the center of the undesirably absorbing layer. The wavelength $\lambda_0$ is taken as the wavelength of most interest for the particular colored pixel, which is the wavelength that the microcavity structure of said pixel is tuned to enhance. It is the absorption of this wavelength in the undesirably absorbing layer that is therefore reduced. It is also possible, however, that absorption at wavelengths slightly offset from the microcavity-enhanced wavelengths can be of interest since the microcavity emission is typically not perfectly narrow, but has some emission bandwidth. However, generally, these two wavelengths are very close.

For a thick opaque reflector, $\phi_r$ is determined from the following equation for the reflection coefficient at the interface written in polar coordinates:

$$|r|\exp(i\phi_r)=(N_j-N_r)/(N_j+N_r) \quad \text{(Eq. 3)}$$

wherein:

$N_r$ is the complex refractive index of the reflector 14;

$N_j$ is the complex refractive index of the layer adjacent to the reflector 14 (e.g., the cavity spacer layer 12 assuming that this layer has non-zero thickness);

$\phi_r$ is the phase shift in radians at the reflector 14 interface, chosen by convention to lie in the interval between $-\pi$ and $\pi$; and $|r|$ is a non-negative real number that gives the magnitude of the reflection coefficient at the interface.

Inserting the complex refractive indices for the ITO cavity spacer layer and the Al reflector at 620 nm yields $\phi_r=-2.731$ radians$=-156.5°$. When this result is inserted into Eq. 2 and solved for the case of m=0, the predicted ITO thickness that maximizes the EL intensity is found to be 159, 158, 156, and 151 nm for 2.5, 5, 10, and 20 nm of CuPC, respectively. These predictions are in agreement with the optical modeling results.

In order for the EL intensity of the OLED device to be optimized, it is desirable to have the center of the undesirably absorbing layer satisfy Eq. 2 with m an integer as stated. However, if the position of the absorbing layer is such that Eq. 2 is satisfied with m lying close to, but not at, an integer value then the EL intensity will still be considerably increased relative to when m is not close to an integer value (with the worst case being when m is equal to an integer plus ½). Therefore, any case where m takes on a value within 0.25 of an integer is advantaged. However, cases where m is within approximately 0.1 of an integer value are preferred.

If m takes on negative integer values, the desired total optical thickness is negative and thus not physically-realizable. However, it can sometimes be advantageous to position the undesirably absorbing layer very close to the reflector 14, such that the optical thickness satisfies Eq. 2 with m having a non-integer value close to $-1$. It can be seen in FIG. 3 that the position of the CuPC layer very close to reflector 14 is indeed a desirable one for this particular device. Because the ITO layer used to space the CuPC layer from the reflector 14 is itself weakly absorbing at 620 nm, the device is predicted to have higher efficiency (for CuPC layer thicknesses of 10 nm or less) when the CuPC layer is very close to reflector 14 rather than when the ITO thickness is ~150 to 160 nm, which corresponds to satisfying Eq. 2 with m=0. A 10 nm CuPC layer immediately adjacent to the Al reflector corresponds to a situation in which m$\cong -0.90$, clearly illustrating the advantage of satisfying Eq. 2 for m having a non-integer value close to $-1$.

Figure 4:
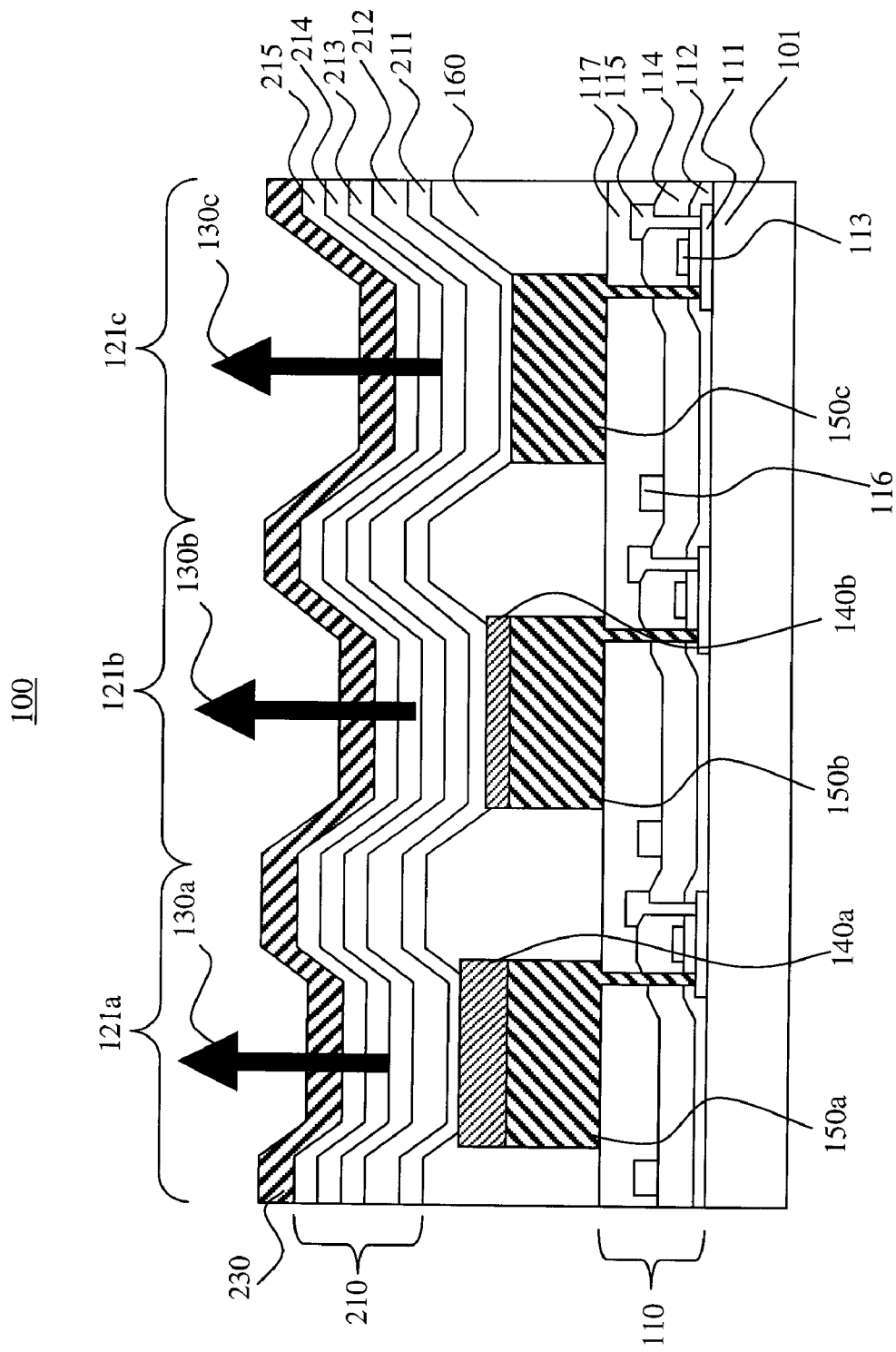
FIG. 4 depicts a cross-sectional view of a multicolor device according to the present invention.

FIG. 4 shows a cross section of microcavity device 100 constructed according to an alternate embodiment of the present invention. Microcavity device 100 is constructed as multicolor device having three different pixels 121a, 121b, 121c. These pixels emit light 130a, 130b, and 130c, having three different colors. Alternate embodiments having more or fewer pixels can also be constructed by one skilled in the art.

Microcavity device 100 shown in FIG. 4 is shown to be constructed with active matrix circuitry 110, however, alternate embodiments which are passive matrix which do not have active matrix circuitry can be applied to the present invention by someone skilled in the art. The active matrix circuitry 110 is formed above substrate 101. Active matrix circuitry 110 includes a first thin film transistor (TFT) comprised of a semiconductor active layer 111, a gate dielectric 112, a gate conductor 113, a first insulating layer 114, and a second insulating layer 117. Active matrix circuitry 110 further includes one signal line 116 that carries the luminance signal and one power line 115 to supply power to the transistor. Each different pixel includes such active matrix circuitry components. Methods of fabricating the TFT circuitry are well known in the art. Methods for forming active matrix circuitry are well known in the art. While only a single transistor, signal line, and power line are shown for each pixel, typically each pixel also has a second transistor (not shown) as well as a capacitor (not shown) and additional select lines (not shown). Many types of circuits having different numbers and configurations of circuit components are known in the art and it is understood that a wide variety of these circuits will work with this invention. Examples of active matrix configurations include those taught in U.S. Pat. Nos. 5,550,066, 6,281,634, and 6,501,466. While the TFTs shown are fabricated with a thin film semiconductor active layer 111, it is understood that with semiconducting substrates, the substrate can actually serve this function. A top gate structure, that is where the gate conductor 113 and the gate dielectric 112 are above the semiconductor active layer 111, is shown here, however, it is also known in the art that TFT's with an inverse structure known as bottom gate can be used to drive OLED devices.

Above the active matrix circuitry, reflectors 150a, 150b, and 150c are formed in pixels 121a, 121b, and 121c, respectively. Cavity spacer layers 140a and 140b are formed above the reflectors in pixels 121a and 121b, respectively. These cavity spacer layers are formed as described above. Pixel 150c is preferably not constructed with a cavity spacer layer to reduce process steps, however in alternate embodiments, a third cavity spacer could be used in this pixel as well. The cavity spacer layers each have a different thickness such that the optical cavity length of the different pixels are separately adjusted to resonate at different wavelengths of light corresponding to their respective colors. For the pixels having a cavity spacer layer, the cavity spacer layer can also serve as an electrode for the organic EL medium 210 so that transparent cavity spacer layer must be electrically connected down to the active matrix components. This can be achieved either directly (not shown) or if the reflector for the pixel is of a conducting material, through the reflector as is shown or with other intermediate conductors (not shown). For pixels not having a cavity spacer such as pixel 121c in microcavity device 100, the reflector can serve as the electrode when constructed of a conductive material. The reflector would then have to be connected to the active matrix circuitry as shown.

An interpixel dielectric layer 160, such as is described in U.S. Pat. No. 6,246,179, is preferably used to cover the edges of the transparent electrodes to prevent shorts or strong electric fields in this area. The interpixel dielectric layer 160 can also cover the cavity spacer as shown if the cavity spacer is conductive or forms part of the electrode. While use of the interpixel dielectric layer 160 is preferred, it is not required for successful implementation of the present invention.

Each of the pixels further includes an organic EL media 210. There are numerous configurations of the organic EL media 210 layers wherein the present invention can be successfully practiced. A broadband or white light source which emits light at the wavelengths used by all the pixels is preferred to avoid having to pattern the organic EL medium between pixels as shown. However, the present invention can also be made to work where each pixel has one or more or all of the organic EL medium layers separately patterned for each pixel. Some examples of organic EL media layers that emit broadband or white light are described, for example, in EP 1 187 235, U.S. Patent Application Publication 2002/0025419, EP 1 182 244, and U.S. Pat. Nos. 5,683,823, 5,503,910, 5,405,709, and 5,283,182. Microcavity device 100 is shown with an example organic EL medium structure. The organic EL medium 210 of microcavity device 100 is constructed of the same layers as described above for microcavity device 10: a hole injecting layer 211; a hole transporting layer 212 that is disposed over the hole injecting layer 211; a first light-emitting layer 213 disposed over the hole transporting layer 212; a second light-emitting layer 214 disposed over the first light-emitting layer 213; and an electron transporting layer 215 disposed over the second light-emitting layer.

Above the organic EL media 210, the semitransparent reflector 230 is formed. The semitransparent reflector is preferably formed of materials such as Ag or an alloy of Ag and formed to a thickness preferably between 5 nm and 35 nm. The reflector can also serve as the second electrode for the organic EL media 210.

In this embodiment of the invention, the cavity spacer layer(s) thicknesses for each differently colored pixel should be chosen in such a way as to reduce the impact of an undesirably absorbing layer for the pixel(s) of a color that is absorbed by the undesirably absorbing layer(s). For example, if the differently colored pixels are designed to emit red, green, and blue light and the undesirably absorbing layer is a hole-injecting layer containing CuPC, it will generally be most desirable that the thicknesses of the cavity spacer layer be chosen such that the absorption of the CuPC is reduced for the red emitting pixel. The location of the CuPC layer is less critical for the green and blue emitting pixels. If the organic layers in each differently colored pixel are patterned independently, then some advantage can still be gained by designing the cavity spacer layer thicknesses in the green and blue pixels in order to reduce the absorption of the CuPC layer in these pixels. However, if the organic layers are common to all differently colored (red, green, and blue) pixels, then the thickness of the organic layers will be set by setting the cavity spacer layer to correctly place the undesirably absorbing CuPC layer to reduce the absorption by Eq. 2, and then the common organic EL medium layers will be determined such that the total optical cavity for the red pixel is tuned to emit at the desired red wavelength. The organic EL medium is therefore fixed by the red pixels so that the cavity spacer layer for the green and blue pixels are adjusted to tune the microcavity structures for those two pixels.

However, one skilled in the art will understand that there are situations, such as one in which the device efficiency is most strongly dependent on improved efficiency of the green pixel, where it can be desirable to optimize the location of the undesirably absorbing layer for the green pixel in order to reduce the absorption in this pixel, or to effect a compromise whereby the location of the undesirably absorbing layer for the red and green pixels are chosen in such a way that the absorption of the undesirably layer is not too high in either of these pixels.

The invention has been described in detail with particular reference to certain preferred embodiments thereof, but it will be understood that variations and modifications can be effected within the spirit and scope of the invention.

PARTS LIST 10 microcavity device
11 semitransparent reflector
12 cavity spacer
14 reflector
16 substrate
17 light emission
20 organic EL medium
21 hole injecting layer
22 hole transporting layer
23 first light-emitting layer
24 second light-emitting layer
25 electron transporting layer
100 microcavity device
101 substrate
110 active matrix circuitry
111 semiconductor active layer
112 gate dielectric
113 gate conductor
114 first insulating layer
115 power line
116 signal line
117 second insulating layer
121a pixel
121b pixel
121c pixel
130a light emission
130b light emission
130c light emission
140a cavity spacer layer
140b cavity spacer layer
150a reflector
150b reflector
150c reflector
160 interpixel dielectric layer
210 organic EL medium
211 hole injecting layer
212 hole transporting layer
213 first light-emitting layer
214 second light-emitting layer
215 electron transporting layer
230 semitransparent reflector

The invention claimed is:
1. An OLED microcavity device that has at least one first pixel that emits light in a desired region of the visible light spectrum, comprising:
a) one or more light-emitting layer(s);
b) a reflector and a semitransparent reflector respectively disposed on opposite sides of the light-emitting layer(s) and arranged to define a microcavity that resonates light produced by such layers such that the light produced by the at least one first pixel has a spectral component in the desired region of the visible light spectrum;
c) at least one layer disposed at a predetermined position between the reflector and the semitransparent reflector which undesirably absorbs light in at least a portion of the desired region of the visible light spectrum; and
d) wherein the predetermined position of the undesirably absorbing layer is selected in accordance with the following equation:

$$[n_a d_a + 2\Sigma(n_i d_i)]/\lambda_0 + \phi_r/(2\pi) = m + \tfrac{1}{2}$$

wherein:
n_a is the index of refraction and d_a is the thickness of the undesirably absorbing layer;
n_i is the index of refraction and d_i is the thickness of the ith layer between the undesirably absorbing layer and the reflector;
$\phi_r$ is the phase shift in radians at the reflector interface, chosen by convention to lie in the interval between $-\pi$ and $\pi$;
λ is the resonant wavelength of the microcavity and corresponds with the primary wavelength emitted by the microcavity device; and
m is within 0.25 of an integer value.

2. The OLED device of claim 1 wherein the thickness of the undesirably absorbing layer is selected to aid in reducing the absorption of such layer in the desired region of the visible light spectrum.

3. The OLED device of claim 2 wherein the selected thickness is in the range of 1 to 10 nm.

4. The OLED device of claim 1 wherein the material of the undesirably absorbing layer provides a hole injecting function.

5. The OLED device of claim 1 wherein the at least one first pixel produces light emission in red region of the visible spectrum.

6. The OLED device of claim 1 wherein the material of the undesirably absorbing layer includes CuPC.

7. The OLED device of claim 1 wherein m is within 0.1 of an integer value.

8. The OLED device of claim 1 further including at least one second pixel that emits light in a different region of the visible light spectrum compared to the emitted light of the at least one first pixel.

9. The OLED device of claim 8 wherein the at least one second pixel comprises:

a) one or more light-emitting layer(s); and
b) a reflector and a semitransparent reflector respectively disposed on opposite sides of the light-emitting layer(s) and arranged to resonate light produced by such layers such that the light produced by the at least one second pixel has a spectral component in the different region of the visible light spectrum.

10. The OLED device of claim 9 wherein the at least one first pixel and the at least one second pixel include the same one or more light-emitting layer(s) having the same materials and thickness.

11. The OLED device of claim 10 wherein the at least one second pixel further includes the same undesirably absorbing layer having same materials and thickness as in the at least one first pixel.

12. The OLED device of claim 11 wherein the at least one second pixel further includes a cavity spacer layer wherein the thickness of the cavity spacer layer, refractive index of the cavity spacer layer, or both, are separately adjusted in conjunction with the thickness and refractive index of the other layers of the at least one second pixel disposed between the reflector and the semitransparent reflector of the at least one second pixel to tune the light emission of the at least one second pixel to be in the different region of the visible light spectrum.

13. The OLED device of claim 8 wherein the at least one first pixel produces light emission in the red region of the visible spectrum, the at least one second pixel includes at least one pixel that produces light emission in the green region of the visible spectrum and at least one pixel that produces light emission in the blue region of the visible spectrum.

* * * * *

UNITED STATES PATENT AND TRADEMARK OFFICE
CERTIFICATE OF CORRECTION

PATENT NO. : 7,196,469 B2 Page 1 of 1
APPLICATION NO. : 10/871190
DATED : March 27, 2007
INVENTOR(S) : Joel D. Shore et al.

It is certified that error appears in the above-identified patent and that said Letters Patent is hereby corrected as shown below:

Column 12, line 67 of claim 1    Delete "$[n_a d_a + 2\Sigma(n_i d_i)]/\lambda_{\bar{o}} + \phi_r/(2\pi) = m + \frac{1}{2}$" and insert --$[n_a d_a + 2\Sigma n_i d_i)]/\lambda + \phi_r/2\pi = m + \frac{1}{2}$--

Signed and Sealed this

Thirteenth Day of November, 2007

JON W. DUDAS
*Director of the United States Patent and Trademark Office*